(12) United States Patent
Nuzzo et al.

(10) Patent No.: US 7,662,545 B2
(45) Date of Patent: Feb. 16, 2010

(54) DECAL TRANSFER LITHOGRAPHY

(75) Inventors: Ralph G. Nuzzo, Champaign, IL (US); William R. Childs, Champaign, IL (US); Michael J. Motala, Champaign, IL (US); Keon Jae Lee, Savoy, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 507 days.

(21) Appl. No.: 10/965,279

(22) Filed: Oct. 14, 2004

(65) Prior Publication Data
US 2006/0084012 A1    Apr. 20, 2006

(51) Int. Cl.
*G03F 7/00* (2006.01)

(52) U.S. Cl. .................. 430/322; 430/323; 430/324; 430/253; 430/254; 430/258; 430/260; 430/256

(58) Field of Classification Search ............... 430/322, 430/324, 394, 311, 256, 258, 253, 323, 254, 430/260
See application file for complete search history.

(56) References Cited

U.S. PATENT DOCUMENTS

| | | | |
|---|---|---|---|
| 3,682,633 A | 8/1972 | Curtin | |
| 3,764,248 A | 10/1973 | Hall | |
| 4,126,292 A | 11/1978 | Saeki et al. | |
| 4,764,244 A | 8/1988 | Chitty et al. | |
| 5,071,597 A | 12/1991 | D'Amato et al. | |
| 5,328,534 A * | 7/1994 | Calhoun et al. | 156/150 |
| 5,502,144 A | 3/1996 | Kuo et al. | |
| 5,534,609 A | 7/1996 | Lewis et al. | |
| 5,538,674 A | 7/1996 | Nisper et al. | |
| 5,618,903 A | 4/1997 | Hoxmeier et al. | |
| 5,637,668 A | 6/1997 | Graiver et al. | |
| 5,661,092 A | 8/1997 | Koberstein et al. | |
| 5,670,598 A | 9/1997 | Leir et al. | |
| 5,676,983 A | 10/1997 | Bacher et al. | |
| 5,741,859 A | 4/1998 | Saxena et al. | |

(Continued)

FOREIGN PATENT DOCUMENTS

EP    0 487 797    6/1992

(Continued)

OTHER PUBLICATIONS

Childs, W.R., et al., "Decal Transfer Microlithography: A New Soft-Lithographic Patterning Method", Journal of the American Chemical Society, vol. 124, No. 45, pp. 13583-13596, (2002).*

(Continued)

*Primary Examiner*—Mark F Huff
*Assistant Examiner*—Caleen O Sullivan
(74) *Attorney, Agent, or Firm*—Blanchard & Associates

(57) ABSTRACT

A method of making a microstructure includes selectively activating a portion of a surface of a silicon-containing elastomer, contacting the activated portion with a substance, and bonding the activated portion and the substance, such that the activated portion of the surface and the substance in contact with the activated portion are irreversibly attached. The selective activation may be accomplished by positioning a mask on the surface of the silicon-containing elastomer, and irradiating the exposed portion with UV radiation.

33 Claims, 11 Drawing Sheets

U.S. PATENT DOCUMENTS

| | | | |
|---|---|---|---|
| 5,744,541 | A | 4/1998 | Sawaguchi et al. |
| 5,795,519 | A | 8/1998 | Bacher et al. |
| 5,932,649 | A | 8/1999 | Hergenrother et al. |
| 5,932,677 | A | 8/1999 | Hoover et al. |
| 6,007,914 | A | 12/1999 | Joseph et al. |
| 6,013,711 | A | 1/2000 | Lewis et al. |
| 6,013,715 | A | 1/2000 | Gornawicz et al. |
| 6,033,202 | A | 3/2000 | Bao et al. |
| 6,072,011 | A | 6/2000 | Hoover |
| 6,090,902 | A | 7/2000 | Kuo et al. |
| 6,103,837 | A | 8/2000 | Hiiro et al. |
| 6,124,411 | A | 9/2000 | Matyjaszewski et al. |
| 6,136,926 | A | 10/2000 | Raetzsch et al. |
| 6,153,691 | A | 11/2000 | Gomowicz et al. |
| 6,235,863 | B1 | 5/2001 | Hoxmeier |
| 6,339,131 | B1 | 1/2002 | Cella et al. |
| 6,344,521 | B1 | 2/2002 | Schwindeman et al. |
| 6,362,288 | B1 | 3/2002 | Brewer et al. |
| 6,363,183 | B1 | 3/2002 | Koh |
| 6,372,532 | B2 | 4/2002 | Bao et al. |
| 6,387,597 | B1 * | 5/2002 | Gelbart ............ 430/311 |
| 6,403,710 | B1 | 6/2002 | Ahmed et al. |
| 6,407,193 | B1 | 6/2002 | Hiiro et al. |
| 6,619,311 | B2 | 9/2003 | O'Connor et al. |
| 6,663,820 | B2 | 12/2003 | Arias et al. |
| 6,686,184 | B1 | 2/2004 | Anderson et al. |
| 6,805,809 | B2 * | 10/2004 | Nuzzo et al. ............ 216/54 |
| 2002/0054862 | A1 | 5/2002 | Perron et al. |
| 2003/0024632 | A1 | 2/2003 | Hahn et al. |
| 2003/0180656 | A1 * | 9/2003 | Matsuzawa ............ 430/270.1 |
| 2005/0199584 | A1 | 9/2005 | Nuzzo et al. |
| 2006/0084012 | A1 | 4/2006 | Nuzzo et al. |

FOREIGN PATENT DOCUMENTS

| | | | |
|---|---|---|---|
| EP | 0487797 | * | 6/1992 |
| WO | WO 01/18857 A1 | | 3/2001 |
| WO | WO 2004/021084 | | 3/2004 |
| WO | WO 2004/021084 A2 | | 3/2004 |
| WO | WO 2006/132664 | | 12/2006 |

OTHER PUBLICATIONS

Allcock, H.R., et al., "Contemporary Polymer Chemistry—Second Edition", published by Prentice-Hall Inc., New Jersey, pp. 146-149, (1990).

Deng, T., et al., "Using patterns in microfiche as photomasks in 10-μm-scale microfabrication", Langmuir, vol. 15, No. 19, pp. 6575-6581, (1999).

Deng, T., et al., "Prototyping of masks, masters, and stamps/molds for soft lithography using an office printer and photographic reduction", Analytical Chemistry, vol. 72, No. 14, pp. 3176-3180, (2000).

Douki, K., et al., "High-Performance 193-nm positive resist using alternating polymer system of functionalized cyclic olefins / maleic anhydride", Advances in Resist Technology and Processing XVII, Proceedings of SPIE, vol. 3999, pp. 1128-1133, (2000).

International Search Report for PCT application No. PCT/US03/26751 dated Feb. 13, 2004.

Ouyang, M., et al., "Conversion of some siloxane polymers to silicon oxide by UV/Ozone photochemical processes", Chem. Mater., vol. 12, No. 6, pp. 1591-1596, (2000).

Stevens, M.P., "Polymer Chemistry: An Introduction—Third Edition", published by Oxford University Press, New York, pp. 276-279, (1999).

Xia, Y., et al., "Soft Lithography", Annu. Rev. Mater. Sci., vol. 28, pp. 153-184, (1998).

Menard, E., et al., "A printable form of silicon for high performance thin film transistors on plastic substrates", Applied Physics Letters, vol. 84, No. 26, pp. 5398-5400, (2004).

Wallraff, G.M., et al., "Lithographic imaging techniques for the formation of nanoscopic features", Chemical Reviews, vol. 99, No. 7, pp. 1801-1821, (1999).

Reichmanis, E., et al., "Organic materials challenges for 193 nm imaging", Accounts of Chemical Research, vol. 32, No. 8, pp. 659-667, (1999).

Houlihan, F.M., et al., "Retrospective of work at Bell Laboratories on the effect of fluorine substitution on the properties of photoacid generators", Journal of Fluorine Chemistry, vol. 122, pp. 47-55, (2003).

Lee, K., et al., "Photolithographic technique for direct photochemical modification and chemical micropatterning of surfaces", Langmuir, vol. 20, No. 5, pp. 1812-1818, (2004).

Childs, W.R., et al., "Decal transfer microlithography: A new soft-lithographic patterning method", Journal of the American Chemical Society, vol. 124, No. 45, pp. 13583-13596, (2002).

Huck, W.T.S. et al., "Ordering of spontaneously formed buckles on planar surfaces", Langmuir, vol. 16, No. 7, pp. 3497-3501, (2000).

Childs, W.R. et al., "Patterning of thin-film microstructures on non-planar substrate surfaces using decal transfer lithography", Advanced Materials, vol. 16, No. 15, pp. 1323-1327, (2004).

International Search Report and Written Opinion dated Feb. 20, 2007 for PCT application No. PCT/US2005/036812, 15 pages.

* cited by examiner

20 μm

5 μm

DECAL TRANSFER LITHOGRAPHY

FEDERALLY SPONSORED RESEARCH OR DEVELOPMENT

The subject matter of this application was in part funded by the National Science Foundation (NSF) Grant no. CHE 0097096; by the Defense Advanced Research Projects Agency (DARPA) Grant no. FA8650-04-C-7101; and by the Department of Energy (DOE) Grant no. DEFG02-91ER45439. The government may have certain rights in this invention.

BACKGROUND

Soft lithography is a versatile patterning technique for use in microfabrication to produce microstructures. This technique uses a patterned elastomer to transfer a pattern from a master to a substrate. The patterned elastomer may be used, for example, as a stamp to transfer a substance, as a mold to be filled by a substance, or as a mask to provide for selective deposition onto a substrate and/or selective removal of material from the substrate. See, for example, Xia, Y. and Whitesides, G. M. *Annu. Rev. Mater. Sci.* (1998) 28:153-184.

In contrast, conventional photolithography utilizes rigid photomasks to pattern photoresist layers, and the patterned photoresist then protects the material beneath the pattern during subsequent etching and deposition steps. Soft lithography provides a number of advantages over conventional photolithography. Soft lithography can yield three-dimensional structures and non-planar structures in a single deposition step, rather than requiring the stepwise assembly of individual layers. Due to the mechanical flexiblility of the elastomer, non-planar substrates can be patterned. The various soft lithographic techniques can also be used with a more diverse range of materials than are available with photolithography, and the materials and techniques used in soft lithography are typically much lower in cost. Because of these advantages, soft lithography has proven useful for applications including integrated optics, microelectromechanical systems (MEMS), microfluidics, and patterning of biological material such as proteins, nucleic acids and cells.

In one example, a patterned elastomeric stamp can be contacted with a substrate to form channels which can exhibit a pattern in two or three dimensions. The channels can then be filled with a liquid precursor for a solid substance, such as a polymer or a ceramic. The channels can also be used to mix different fluid substances, thus functioning as a microreactor or a microanalytical tool. The formation of solid patterned structures with this technique is referred to as Micromolding In Capillaries, or "MIMIC." Drawbacks to this technique include the need for the pattern to be continuous to allow the entire pattern to be filled. Also, the channels must be large enough to accommodate the viscosity of the liquid used to fill the pattern, which can limit the resolution that can be obtained.

In another example, a patterned elastomeric stamp can be coated with a substance and then contacted with a substrate. Removal of the stamp results in a deposition of the substance onto the substrate in the pattern of the stamp. The substance which is transferred thus functions as an ink which is printed onto the substrate. This technique, referred to as microcontact printing or "μCP," can be used to form discontinuous patterns, and can form patterns with higher resolution than MIMIC. Applications of microcontact printing typically involve additive lithography, which is the selective deposition of another substance on either the patterned ink or on the exposed substrate. Drawbacks to this technique include the limited range of materials which can be used as the substrate and as the ink.

In yet another example, a patterned elastomeric membrane can be applied to a substrate. This membrane can then function as a mask for selective removal of the exposed substrate (subtractive lithography), or for additive lithography. Depending on the materials used for the membrane and the substrate, reversible bonding between the two can be used to stabilize the membrane during the desired microfabrication and to remove the membrane once it has served its intended purpose. Drawbacks to this technique include the extreme difficulty in applying, removing, and manipulating the thin elastomeric membrane. Also, the membrane must be continuous and cannot be used for imaging discrete forms and patterns.

It is thus desirable to provide an improved soft lithographic technique that can be used to form patterns that are continuous or discrete, two dimensional or three dimensional, on planar and non-planar substrates, and that may be in the form of channels or masks for additive and subtractive lithography. It is also desirable that these patterns can be formed on and with a wide range of substances, without the need for delicate handling of the materials involved.

BRIEF SUMMARY

In a first embodiment of the invention, there is provided a method of making a microstructure, comprising selectively activating a portion of a surface of a silicon-containing elastomer, contacting the activated portion with a substance, and bonding the activated portion and the substance, such that the activated portion and the substance in contact with the activated portion are irreversibly attached.

These embodiments may include a method wherein the selectively activating comprises partially covering the surface to provide a protected portion of the surface and an unprotected portion of the surface, and applying an activating treatment to the unprotected portion. These embodiments may further include a method wherein the applying an activating treatment comprises irradiating the unprotected portion with UV radiation. These embodiments may further include a method wherein the partially covering the surface comprises positioning a mask on the surface of the silicon-containing elastomer. The mask comprises a pattern of UV-opaque portions and UV-transparent portions and comprises a spacer material under the UV-opaque portions, and the unprotected portion of the surface is below and spaced apart from the UV-transparent portions.

In a second embodiment of the invention, there is provided a method of making a microstructure, comprising positioning a mask on an unpatterned surface of a silicon-containing elastomer. The mask comprises a pattern of UV-opaque portions and UV-transparent portions and comprises a spacer material under the UV-opaque portions, and the unpatterned surface comprises an exposed portion below and spaced apart from the UV-transparent portions. The method further comprises irradiating the exposed portion of the unpatterned surface with UV radiation, removing the mask from the surface, contacting the surface with a substrate, and separating the silicon-containing elastomer and the substrate, such that the substrate and the exposed portion of the surface remain in contact.

In a third embodiment of the invention, there is provided a method of making a microstructure, comprising positioning a mask on a surface of a silicon-containing elastomer comprising a pattern of raised areas and lowered areas. The mask comprises a pattern of UV-opaque portions and UV-transparent portions and comprises a spacer material under the UV-opaque portions, and the surface comprising an exposed portion of raised areas below and spaced apart from the UV-transparent portions. The method further comprises irradiating the exposed portion of raised areas with UV radiation, removing the mask from the surface, contacting the raised areas with a substrate, and separating the silicon-containing elastomer and the substrate, such that the substrate and the exposed portion of the raised areas remain in contact.

These embodiments may include a method further comprising, after the separating, applying an etching agent to the substrate to remove a portion of the substrate which is not in contact with the exposed portion of the surface; and removing the silicon-containing elastomer from the substrate.

These embodiments may include a method further comprising, after the separating, depositing a material on the substrate; and removing the silicon-containing elastomer from the substrate to provide a pattern of the deposited material.

In a fourth embodiment of the invention, there is provided a method of making a microstructure, comprising positioning a mask on a surface of a silicon-containing elastomer. The mask comprises a pattern of UV-opaque portions and UV-transparent portions and comprises a spacer material under the UV-opaque portions, and the surface comprises an exposed portion below and spaced apart from the UV-transparent portions. The method further comprises irradiating the exposed portion with UV radiation; removing the mask from the surface, contacting the surface with a discrete material, and removing unbound discrete material from the surface, such that the exposed portion and the discrete material in contact with the exposed portion remain attached.

In a fifth embodiment of the invention, there is provided a method of making a microstructure, comprising positioning a mask on a surface of a silicon-containing elastomer. The mask comprises a pattern of UV-opaque portions and UV-transparent portions and comprises a spacer material under the UV-opaque portions, and the surface comprises an exposed portion below and spaced apart from the UV-transparent portions. The method further comprises irradiating the exposed portion with UV radiation, removing the mask from the surface, contacting the surface with a chemical compound, and rinsing the silicon-containing elastomer, such that the silicon-containing elastomer and the chemical compound in contact with the activated portion of the surface remain attached.

In a sixth embodiment of the invention, there is provided a method of selectively activating a surface, comprising positioning a mask on a surface of a silicon-containing elastomer. The mask comprises a pattern of UV-opaque portions and UV-transparent portions and comprises a spacer material under the UV-opaque portions, and the surface comprises an exposed portion below and spaced apart from the UV-transparent portions. The method further comprises irradiating the exposed portion of the surface with UV radiation.

DETAILED DESCRIPTION

Figure 1:
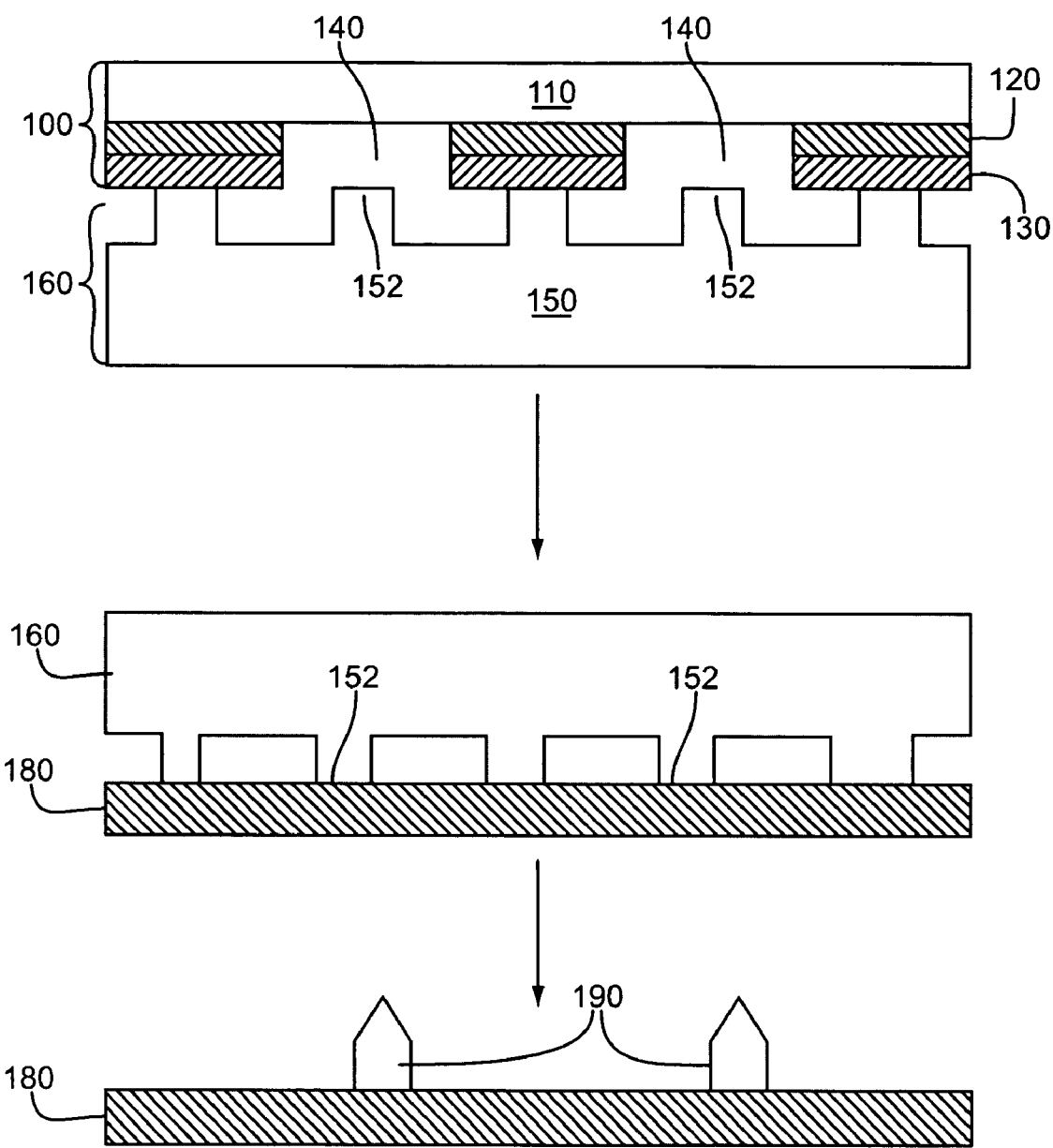
FIG. 1 is a diagram of a pattern transfer method using Photodefined Cohesive Mechanical Failure (P-CMF)

In a first aspect of the invention, a method of making a microstructure includes selectively activating a portion of a surface of a silicon-containing elastomer, contacting the activated portion with a substance, and bonding the activated portion and the substance. The activated portion of the surface and the substance in contact with the activated portion are irreversibly attached.

These aspects may include a method wherein the selectively activating includes partially covering the surface to provide a protected portion of the surface and an unprotected portion of the surface, and applying an activating treatment to the unprotected portion. These aspects may further include a method wherein the applying an activating treatment includes irradiating the unprotected portion with UV radiation. These aspects may further include a method wherein the partially covering the surface includes positioning a mask on the surface of the silicon-containing elastomer. The mask has a pattern of UV-opaque portions and UV-transparent portions and includes a spacer material under the UV-opaque portions. The unprotected portion of the surface is below and spaced apart from the UV-transparent portions.

In a second aspect of the invention, a method of making a microstructure includes positioning a mask as described above on an unpatterned surface of a silicon-containing elastomer, such that the unpatterned surface has an exposed portion below and spaced apart from the UV-transparent portions, irradiating the exposed portion of the unpatterned surface with UV radiation, removing the mask from the surface, contacting the surface with a substrate, and separating the silicon-containing elastomer and the substrate. The substrate and the exposed portion of the surface remain in contact.

In a third aspect of the invention, a method of making a microstructure includes positioning a mask as described above on a surface of a silicon-containing elastomer having a pattern of raised areas and lowered areas, such that the surface has an exposed portion of raised areas below and spaced apart from the UV-transparent portions, irradiating the exposed portion of raised areas with UV radiation, removing the mask from the surface, contacting the raised areas with a substrate, and separating the silicon-containing elastomer and the substrate. The substrate and the exposed portion of the raised areas remain in contact.

These aspects may also include a method where, after the separating, an etching agent is applied to the substrate to remove a portion of the substrate which is not in contact with the exposed portion of the surface. The silicon-containing elastomer may then be removed from the substrate. These embodiments may also include a method where, after the separating, a material is deposited on the substrate. The silicon-containing elastomer may then be removed from the substrate to provide a pattern of the deposited material.

In a fourth aspect of the invention, a method of making a microstructure includes positioning a mask as described above on a surface of a silicon-containing elastomer, such that the surface has an exposed portion below and spaced apart from the UV-transparent portions, irradiating the exposed portion with UV radiation; removing the mask from the surface, contacting the surface with a discrete material, and removing unbound discrete material from the surface. The exposed portion and the discrete material in contact with the exposed portion remain attached.

In a fifth aspect of the invention, a method of making a microstructure includes positioning a mask as described above on a surface of a silicon-containing elastomer, such that the surface has an exposed portion below and spaced apart from the UV-transparent portions, irradiating the exposed portion with UV radiation, removing the mask from the surface, contacting the surface with a chemical compound, and rinsing the silicon-containing elastomer. The silicon-containing elastomer and the chemical compound in contact with the activated portion of the surface remain attached.

In a sixth aspect of the invention, a method of selectively activating a surface includes positioning a mask as described above on a surface of a silicon-containing elastomer, such that the surface has an exposed portion below and spaced apart from the UV-transparent portions, and irradiating the exposed portion of the surface with UV radiation.

The term "microstructure," as used herein, is defined as a structure or pattern containing features which are 1,000 micrometers (μm) or smaller. The formation of microstructures is referred to herein as "microfabrication" and includes, but is not limited to, techniques such as microlithography, soft lithography, MIMIC, and self-assembly.

The term "activate," as used herein with respect to silicon-containing elastomers, is defined as converting an inert surface into a reactive surface. For example, a surface in its normal, unactivated state may not adhere to a substrate; however, activation of this surface provides for strong adhesion between the surface and the same substrate.

The term "selectively activate," as used herein, is defined as activating a specific portion of a surface, while maintaining the rest of the surface in an unactivated state.

The term "irreversibly attached," as used herein, means that the bonding between two substances is sufficiently strong that the substances cannot be mechanically separated without damaging or destroying one or both of the substances. Substances which are irreversibly attached may be separated by exposure to an appropriate chemical environment, such as chemical reagents or irradiation.

The term "on" is defined as "above" and is relative to the orientation being described. For example, if a first element is positioned over at least a portion of a second element, the first element is said to be "positioned on" the second. In another example, if a first element is present above at least a portion of a second element, the first element is said to be "on" the second. The use of the term "on" does not exclude the presence of substances between the upper and lower elements being described. For example, a first element may have a coating over its top surface, yet a second element over at least a portion of the first element and its top coating can be described as "on" the first element. Thus, the use of the term "on" may or may not mean that the two elements being related are in physical contact with each other.

Similarly, the term "under" is defined as "below" relative to the orientation being described. The use of the term "under" does not preclude the presence of substances between the elements being described, and may or may not mean that the elements are in physical contact with each other.

The term "elastomer," as used herein, is defined as a polymer which can return to its initial dimensions when deformed by an external force. A polymer is considered an elastomer when it meets the following standard. A sample of the polymer in its solid state and having an initial linear dimension $D^o$ is subjected to a force such that the dimension is changed by 10%. Once the force is no longer applied, the dimension assumes a value of $D^e$, where $D^e=D^o\pm0.01D^o$.

The term "silicon-containing elastomer," as used herein, is an elastomer which contains silicon (Si) atoms. Examples of silicon-containing elastomers include, but are not limited to, polysiloxanes, such as poly(dimethyl siloxane), poly(methyl siloxane), partially alkylated poly(methyl siloxane), poly(alkyl methyl siloxane) and poly(phenyl methyl siloxane); block copolymers containing segments of a polysiloxane and another polymer; silicon-modified elastomers, such as silicon-modified natural rubber, silicon-modified polyolefins (including silicon-modified polyisoprene, silicon-modified polybutadiene, and silicon-modified polyisobutylene), silicon-modified polyimides, silicon-modified crosslinked phenol-formaldehyde resins (Si-modified NOVOLAC), and silicon-modified polyurethane elastomers. Silicon modification of elastomers may be carried out by reactions with silanes and siloxanes, including hydrosilation and condensation. Preferably the silicon-containing elastomer is a polysiloxane. More preferably, the silicon-containing elastomer is poly(dimethyl siloxane), referred to as "PDMS."

Further examples of silicon-containing elastomers include block copolymers of polysiloxanes with other polymers. For example, block copolymers containing polysiloxanes may be formed with polyolefins such as polyethylene (U.S. Pat. No. 5,618,903, incorporated herein by reference), poly(isobutylene) (U.S. Pat. No. 5,741,859, incorporated herein by reference), polypropylene (U.S. Pat. No. 5,744,541, incorporated herein by reference), polystyrene and various polydienes (U.S. Pat. No. 5,932,649, incorporated herein by reference), and polyisoprene and polybutadiene (U.S. Pat. No. 6,362,288, incorporated herein by reference). In another example, block copolymers containing polysiloxanes may be formed with acrylates (U.S. Pat. No. 6,090,902, incorporated herein by reference), with a wide variety of polymers formed by polymerization of unsaturated monomers (U.S. Pat. No. 6,124,411, incorporated herein by reference), and with a variety of types of siloxanes (U.S. Pat. No. 5,637,668, incorporated herein by reference). In another example, block copolymers containing polysiloxanes may be formed with condensation polymers such as polycarbonates (U.S. Pat. No. 6,072,011, incorporated herein by reference) and poly(arylene ethers) (U.S. Pat. No. 6,339,131, incorporated herein by reference) and may also be formed with polyethers such as polyethylene oxide and polypropylene oxide (U.S. Pat. No. 6,013,711, incorporated herein by reference). Further examples of silicon-containing elastomers include copolymers containing polysiloxane repeat units in combination with polyester and/or polycarbonate repeat units (U.S. Pat.

No. 6,407,193, incorporated-herein by reference), and also include blends of polysiloxanes with polyamides (U.S. Pat. No. 6,344,521, incorporated herein by reference) and blends of polysiloxanes with polyolefins, polyurethanes, or styrenic polymers (U.S. Pat. No. 6,153,691, incorporated herein by reference). Further examples of silicon-containing elastomers include polymers modified to contain silicon by treatment with silane compounds (U.S. Pat. No. 6,136,926, incorporated herein by reference).

Microstructures containing a silicon-containing elastomer can be prepared by irreversibly bonding an activated silicon-containing elastomer and another material. For example, activation of a portion of a silicon-containing elastomer, followed by contacting and bonding the surface of the activated portion with a monolithic substrate can form an irreversible attachment between the activated portion of the elastomer and the substrate. When the elastomer is pulled away or otherwise separated from the substrate, the elastomer can undergo cohesive failure, separating the bulk portion from the activated portion. Preferably, the cohesive failure is such that a film of elastomer material remains bonded to the substrate only in regions where the elastomer surface has been activated and then placed in contact with the substrate. In another example, contacting and bonding of a silicon-containing elastomer having an activated portion with a chemical compound or a discrete material can provide for a pattern of the compound or material on the elastomer surface.

The selective activation of a portion of a silicon-containing elastomer may be accomplished by protecting a portion of a silicon-containing elastomer, and then applying an activating treatment to the unprotected portion. For example, a hard mask may be formed on a surface of a silicon-containing elastomer, and the exposed portions of the elastomer surface can be subjected to an activating treatment. The hard mask must then be removed before the elastomer can be bonded to another material. In another example, a free-standing mask can be positioned on the surface of the silicon-containing elastomer, such that the mask and elastomer can be separated readily after the activating treatment.

The activating treatment can be any of a variety of treatments known in the art, provided the desired portions of the elastomer can be protected from the treatment. In one method, for example, the elastomer can be exposed to an oxygenated plasma to activate the exposed elastomer surface. This activation can be carried out by converting a stream of oxygen into a plasma at a temperature as low as 40° C. In another method, the silicon-containing elastomer is activated by oxidation through a UV/Ozone treatment. This treatment process, referred to as "UVO," is described, for example in co-pending U.S. patent application Ser. No. 10/230,882 (U.S. Pat. No. 6,805,809), which is incorporated herein by reference. The UVO process involves oxidation of the surface of a silicon-containing elastomer by exposing the surface to ultraviolet radiation sufficient to generate ozone and/or other oxidizing species, such as singlet oxygen, from an ambient atmosphere. Activation by UVO can also include exposing the surface to an atmosphere enriched in either molecular oxygen ($O_2$) or ozone ($O_3$). One advantage of the activation by UVO is that the silicon-containing elastomer can become sufficiently activated under mild conditions.

The amount of UVO treatment may be varied depending on the type of silicon-containing elastomer and the type of material to which the elastomer is to be bonded. For example, for polysiloxanes containing alkyl or aryl organic side groups which are less volatile than the methyl groups of PDMS, the UVO may need to be applied for longer periods of time. Also, for silicon-modified elastomers and polysiloxane-containing block copolymers, an increased duration of UVO may be needed, since the silicon atoms are less concentrated than in PDMS. The UV source for the UVO treatment may be any of a variety of UV sources. Examples of UV sources include mercury discharge lamps, and deuterium discharge lamps. Preferably the UV source is a deuterium discharge lamp.

A silicon-containing elastomer can be selectively activated using UVO by applying the UVO treatment to an elastomer that has been covered with a mask. The mask for UVO treatment preferably provides both for transmission of UV radiation to the exposed regions of the elastomer and for contact of the exposed regions with an atmosphere containing oxygen. The oxygen present in this atmosphere, in combination with UV radiation, can serve to activate the exposed portion of the elastomer.

The general design of a mask 100 for selective UVO activation is shown in FIGS. 1-4, in which a UV-transparent lens 110 is partially covered with a UV-opaque layer 120. The patterned UV-opaque layer is covered with a spacer material 130. The gap 140 defined by the UV-transparent material 110, the exposed portion 152 of the silicon-containing elastomer 150, and the spacers 130 allows the elastomer to be in contact with an atmosphere during the UVO treatment. In a specific example of a UVO mask, the UV-transparent lens is a quartz lens, and the UV-opaque film is a patterned gold film. It may be desirable to provide a titanium layer between the quartz and the gold film, in which case the titanium preferably has the same pattern as the gold film.

Preferably, the spacer material is the photoresist material that was used to pattern the UV-opaque film. Although a photoresist material is typically removed after the underlying layer or layers have been patterned, the use of the photoresist as the spacer material can provide a number of advantages. Photoresists are typically deposited in a layer of uniform, controllable thickness, thus the resulting spacer material will likewise have a uniform thickness that can be varied as needed. In addition, since the photoresist is originally used to pattern the UV-opaque layer, the spacer material is already in alignment with the UV-opaque portions of the mask, providing for precise definition of the UV-transparent openings in the mask. Photoresist material can be selected to constrain the UV radiation and possibly to inhibit the migration of photogenerated reactive species. A specific example of a photoresist that can also be used as the spacer material is the SU-8 series of photoresists, which can allow for patterning of features from 1 μm or less to 200 μm or greater.

The thickness of the spacer material can be varied. In the example of photoresist material as the spacer, the thickness can be controlled at the outset of the patterning process by controlling the initial thickness of the photoresist that is deposited on the UV-opaque layer. Preferably, the spacer material is sufficiently thick to allow for adequate amounts of oxygen in the gap region between the elastomer and the UV-transparent portion of the mask. Preferably the thickness of the spacer is at least 100 nanometers, more preferably at least 0.5 microns, and even more preferably at least 3 microns.

Selective activation of a silicon-containing elastomer can be used to deposit a pattern of the elastomer on a substrate. The activated surface of a silicon-containing elastomer can be irreversibly attached to the surface of a substrate material by contacting the activated surface and the substrate and bonding together the surface and the substrate. Suitable substrates include, but are not limited to, silicon; ceramic materials such as silicon oxide, quartz and glass; polymers such as polystyrene and silicon-containing elastomers, including PDMS; and metals such as titanium, chromium, tungsten, and gold.

Preferably, the surface of the silicon-containing elastomer is treated with UVO at ambient temperature for an appropriate length of time and is then immediately contacted with a substrate that has been recently cleaned.

The elastomer and substrate are kept in contact to allow the formation of an irreversible bond. The contacted elastomer and substrate may be subjected to heating and/or supplemental ultraviolet radiation to assist the formation of the bond. For example, after contacting UVO treated PDMS with a silicon substrate, the irreversible bond can be obtained by maintaining the contact for about 16 hours at ambient temperature, by maintaining the materials at 70° C. for at least 20 minutes, or by applying UV radiation to the PDMS for at least 30 minutes. Exposure of unoxidized silicon-containing elastomers to only one of heat, ozone or UV radiation will not typically provide irreversible adhesion to substrates.

The initial contact between the UVO-activated surface of the silicon-containing elastomer and the substrate surface typically will not result in an irreversible bond. This phenomenon allows for the precise positioning of the elastomer and the substrate. Thus, any patterns in the elastomer and/or the substrate can be aligned or registered prior to the formation of an irreversible bond. The use of an optically transparent silicon-containing elastomer (such as PDMS) may also be desirable, in that alignment or registration of films and patterns can be done using optical observation.

It may be desirable to clean the surface of the substrate prior to contacting the substrate with the UVO-activated silicon-containing elastomer. Substrates may be cleaned by conventional methods. For example, substrates of silicon or silicon oxide can be rinsed with solvents such as hexanes and ethanol and dried under an inert gas such as nitrogen. In another example, glass and quartz can be rinsed with reagents such as piranha (sulfuric acid and hydrogen peroxide). The substrate may also be cleaned and/or activated by exposure to UVO, to a plasma such as an argon plasma or other plasma, or to other chemical treatments. It may also be desirable to treat the surface of the substrate with UVO immediately prior to contacting it with the activated elastomer. The treatment of the substrate may conveniently be carried out by subjecting the elastomer surface and the substrate surface to the same UVO exposure. For metal substrates such as gold, it may be useful to apply an adhesion promoter such as a thiol compound to the metal surface and/or the elastomer surface. Examples of thiol compounds include thiol-silane compounds such as (thiolpropyl)-trimethoxysilane.

Referring to FIG. 1, the selective activation of a silicon-containing elastomer can be used to deposit a portion of a pre-formed pattern of an elastomer onto a substrate. This process, referred to as "Photodefined Cohesive Mechanical Failure" (P-CMF), uses a patterned stamp 160 to provide the basic pattern of the silicon-containing elastomer. This basic pattern is then further defined by selective activation of the raised portions of the pattern in the stamp. The patterned stamp 160 is placed into contact with the patterned side of a UVO photomask 100, and is then irradiated through the mask by a UV source. After UV irradiation, the stamp is peeled away from the UVO photomask, and the patterned face of the stamp is placed promptly into contact with a substrate material 180. Preferably the time between the end of the irradiation and the contact with the substrate is less than one minute. While maintaining contact, the stamp and substrate are subjected to the conditions necessary to form an irreversible bond between the elastomer and the substrate. Starting from any corner, tweezers are used to peel the stamp away to leave a patterned film 190 on the substrate.

Figure 2:
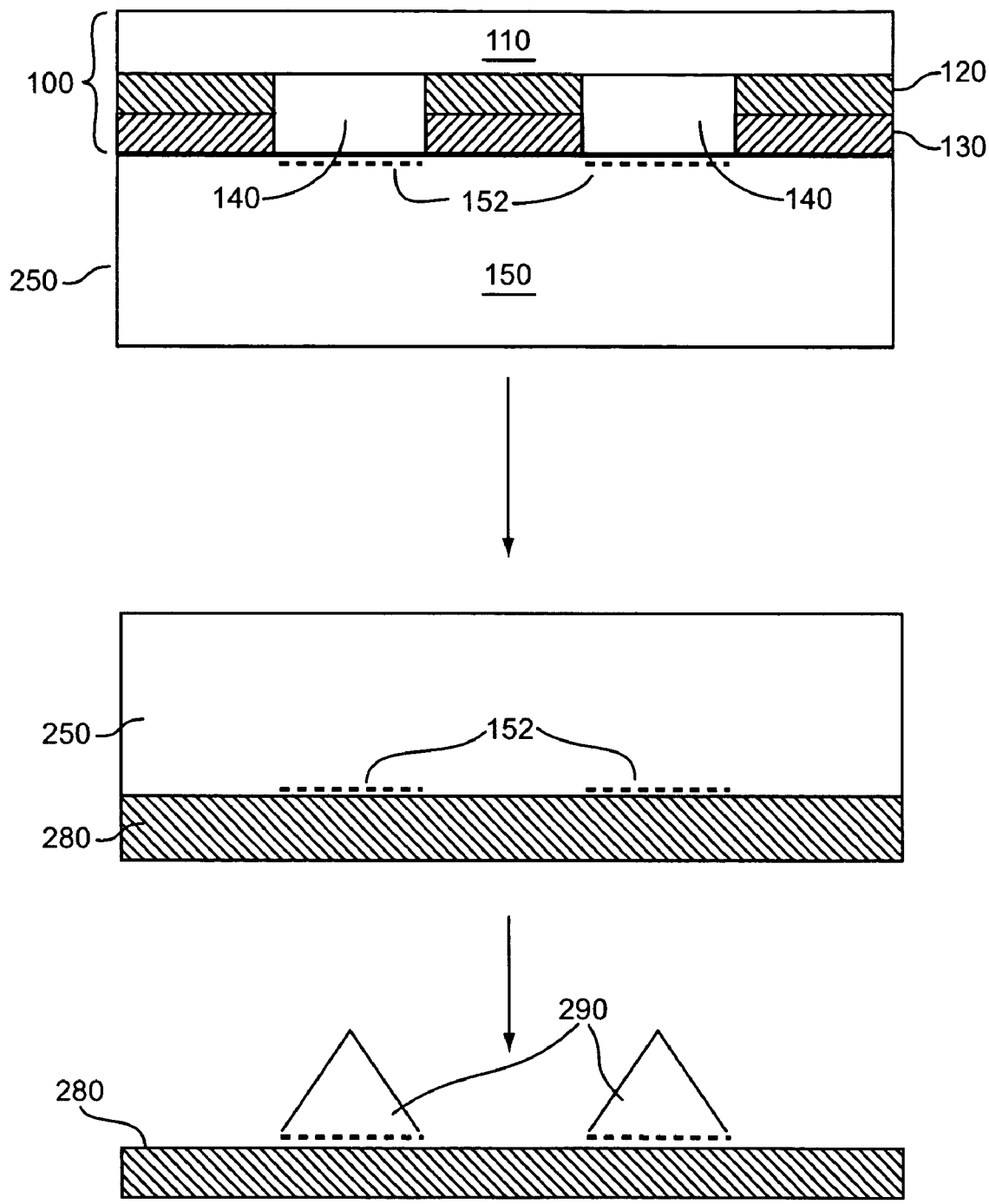
FIG. 2 is a diagram of a pattern transfer method using direct lithography.

Referring to FIG. 2, the selective activation of a silicon-containing elastomer can be used to deposit a portion of an unpatterned elastomer onto a substrate. This process, referred to as "direct lithography," uses a planar blank of elastomer 250, such that all patterning is a result of the selective activation process. The elastomer blank is placed into contact with the patterned side of a UVO photomask 100, and is then irradiated through the mask by a UV source. After UV irradiation, the elastomer is peeled away from the UVO photomask, and the irradiated surface of the blank is placed promptly into contact with a substrate material 280. Preferably the time between the end of the irradiation and the contact with the substrate is less than one minute. While maintaining contact, the elastomer and substrate are subjected to the conditions necessary to form an irreversible bond between the elastomer and the substrate. Starting from any corner, tweezers are used to peel the elastomer away to leave a patterned film 290 on the substrate.

The elastomer pattern transfers of these P-CMF and direct lithography methods involve contributions of chemically activated adhesive bonding and cohesive material failure processes. The yield strength of the patterned elastomer as it is peeled from the substrate can be affected both by the total elastomer contact area and by the feature sizes. Thus, the patterning method based on cohesive failure is especially useful for transferring patterns with small feature sizes (100 µm or smaller) over relatively large areas. One advantage of this method is that it can transfer patterns in a manner that allows registration of multiple patterns and that enables micron scale patterning over large areas. The locus of the cohesive failure of the elastomer progressively approaches that of the surface of the features as their sizes approach the 1 micron level. Pattern transfers in a thickness range of 10-100 nm can be attained for a 1.0 µm minimum feature size, based on a master with a 1 µm feature height as a specific example. The removal of the bulk elastomer for these small features sizes also tends to require a lower amount of force.

The direct lithography process in particular can provide for the formation of patterns at the sub-micron scale. Although the gap formed between the elastomer and the mask at these dimensions is extremely small (on the order of nanoliters), there is sufficient oxygen present to provide for effective UVO activation. An example of a sub-micron patterned structure is shown in the Atomic Force Microscopy (AFM) images of FIGS. 8A and 8B. The line pattern shown contains lines having widths and separations of approximately 300 nm.

The P-CMF process in particular can provide for the formation of arrays of patterns. If the minimum dimensions of the mask pattern are larger than the minimum dimensions of the pattern in the initial elastomer stamp, then a subset of the pattern in the stamp can be transferred to the substrate. An example of an array of a cylindrical pattern is shown in the optical micrograph of FIG. 5A. An example of an array of a pattern of lines is shown in the optical micrographs of FIGS. 6A and 6C. This pattern of lines is illustrated as transferred to a pattern of gold lines in FIG. 6D.

The decal transfer methods allow the deposition of precisely designed polymer thin-films with a remarkable range of feature sizes. Minimum feature sizes in these patterns may be less than 100 micrometers. Preferably, minimum feature sizes are from 1 nanometer to 100 micrometers, and more preferably from 10 nanometers to 10 micrometers. In one example, the minimum feature size is less than 1 micrometer.

Selective activation of a silicon-containing elastomer can be used to form a pattern of another material. For example, an etching agent can be applied to the substrate so as to remove the portion of the substrate that is not attached to the patterned elastomer. Subsequent removal of the elastomer can provide a pattern in the substrate. In another example, a separate material can be deposited onto the substrate and the patterned elastomer. Subsequent removal of the elastomer can provide a pattern of the deposited material. In addition to these lithographic techniques, patterning of other materials can be accomplished by attaching the activated surface of a silicon-containing elastomer to individual chemical compounds, to discrete materials, or to monolithic materials having a cohesive force weaker than that of the elastomer.

Figure 3:
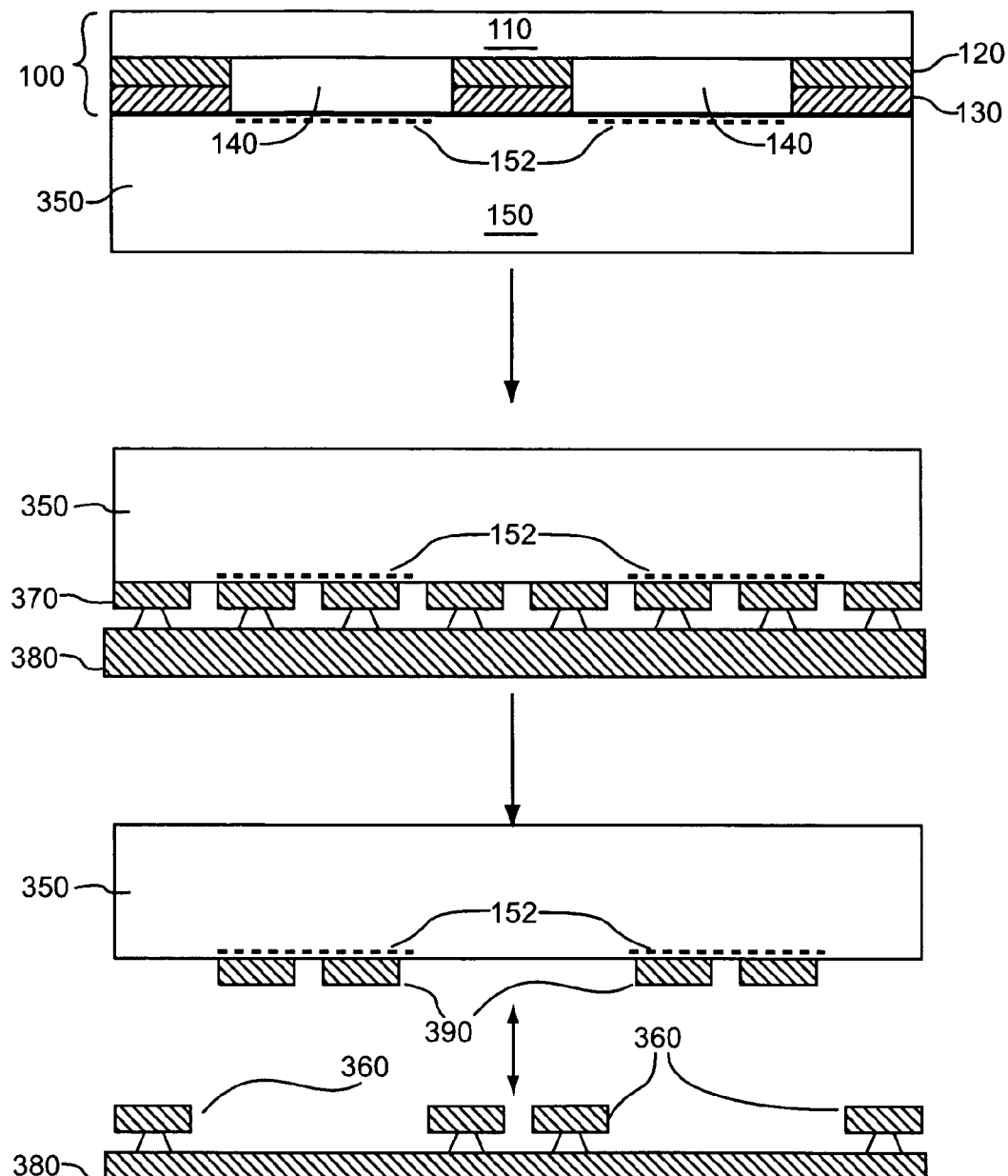
FIG. 3 is a diagram of a method of patterning a discrete material.

Referring to FIG. 3, the selective activation of a silicon-containing elastomer can be used to remove a portion of discrete material from another substrate. Although a planar blank 350 of elastomer is pictured, a patterned stamp could also be used. The elastomer is placed into contact with the patterned side of a UVO photomask 100, and is then irradiated through the mask by a UV source. After UV irradiation, the elastomer is peeled away from the UVO photomask, and the irradiated surface of the blank is placed promptly into contact with the layer of discrete material 370 on the substrate 380. While maintaining contact, the elastomer, discrete material and substrate are subjected to the conditions necessary to form an irreversible bond between the elastomer and the discrete material. The elastomer can then be lifted away from the substrate to provide a substrate having a pattern 390 of discrete material on its surface. This process also provides a pattern 360 of the discrete material on the silicon-containing elastomer.

The discrete material can be in a variety of forms. For example, the discrete material may contain powders, particles, platelets, nanotubes, fibers or wires of materials such as silicon; ceramic materials such as silicon oxide, quartz and glass; polymers such as polystyrene and silicon-containing elastomers, including PDMS; and metals such as titanium, chromium, tungsten, and gold.

Figure 4:
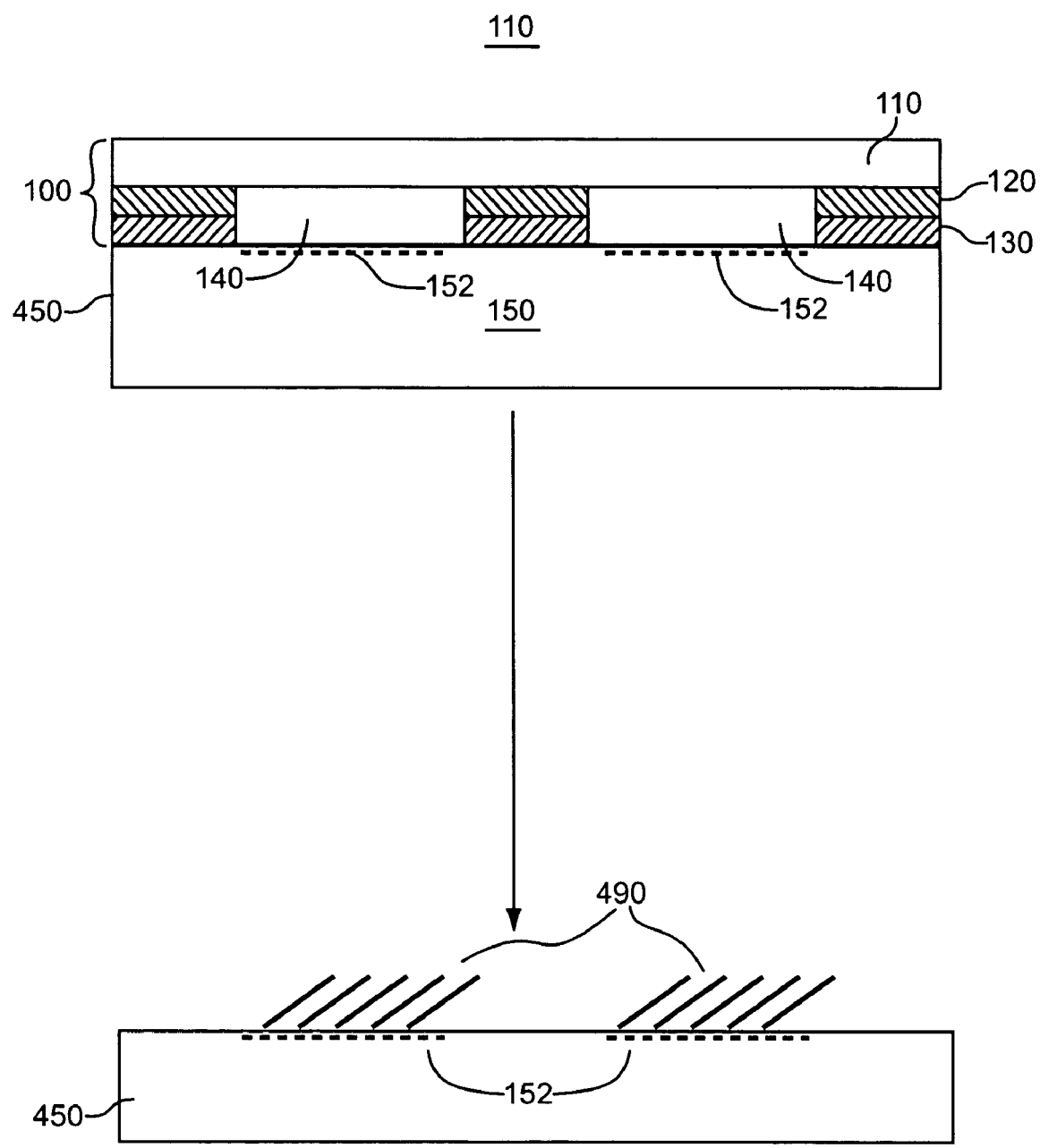
FIG. 4 is a diagram of a method of patterning a chemical compound.

Referring to FIG. 4, the selective activation of a silicon-containing elastomer can be used to form a pattern of a compound on the surface of the silicon-containing elastomer. Again, either a planar blank 450 of elastomer or a patterned stamp could be used. The elastomer is placed into contact with the patterned side of a UVO photomask 100, and is then irradiated through the mask by a UV source. After UV irradiation, the elastomer is peeled away from the UVO photomask, and the irradiated surface of the blank is promptly contacted with the compound, either neat or in a liquid carrier. In some cases, the compound will rapidly adsorb to the activated portions of the elastomer. In other cases, the elastomer and compound must undergo a post-treatment to maintain the compound in the pattern 490. Examples of compounds that can be adsorbed onto an activated surface of a silicon-containing elastomer include alcohols, carbonyl-containing compounds, and compounds having one or more silicon-halogen bonds.

EXAMPLES

Polydimethylsiloxane (PDMS) precursor was obtained from DOW CORNING (Midland, Mich.) as SYLGARD 184. Boron doped silicon wafers (<100>) were obtained from SILICON SENSE, INC. (Nashua, N.H.). Quartz slides were obtained from CHEMGLASS, INC. (Vineland, N.J.). (Tridecafluoro-1,1,2,2-tetrahydrooctyl)trichlorosilane (TFOTS) was obtained from GELEST (Morrisville, Pa.). Tetrabutylammonium fluoride (TBAF, 1 molar in tetrahydrofuran), (mercaptopropyl)trimethoxysilane (MPTMS), and 2,2,2-trifluoroethanol were obtained from ALDRICH (Milwaukee, Wis.). Buffered hydrofluoric acid (6:1, $NH_4F/HF$) was obtained from ASHLAND (Dublin, Ohio). Gold etchant was obtained as TFA from TRANSENE (Danvers, Mass.). Sulfuric acid, hydrofluoric acid (49%), and hydrogen peroxide (30%) were obtained from FISHER (Springfield, N.J.). Solvents were obtained from Fisher and from Aldrich.

Silicon oxides were grown on silicon wafers under an ambient atmosphere by heating them to around 800° C. for several hours to give a ~2500 Å thick oxide layer. Masters were produced as described in Deng et al., *Anal. Chem.* 73:3176-3180 (2000) and in Deng et al., *Langmuir* 15:6575-6581 (1999). Contact photolithography was used to make master patterns by patterning either AZ 5214 (CLARIANT, Sommerville, N.J.) or SU-8 5 (MICROCHEM, Newton, Mass.) photoresists, using 5080 dpi transparencies as an exposure mask. All photoresist masters used as molds were cleaned using a UVO treatment and treated with TFOTS (as a mold release agent) in a closed container at around ~150 mTorr for two hours. Solvents used in processing the samples were of analytical grade or higher and used without purification.

The UV source used for UVO treatments was either a low-pressure mercury lamp (BHK, Claremont, Calif.) or a deuterium lamp (Hamamatsu D101BS). The intensities for each bulb, measured from 230-250 nm using a MIMIR Optical Powermeter Model 100 were determined to be 100 $\mu W/cm^2$ at 3 cm distance from the mercury bulb and 530 $\mu W/cm^2$ at 1 cm from the deuterium bulb. A 03V5-5 ozone generator (OREC, Akron, Ohio) was used as UV independent source of ozone.

Optical micrographs were recorded using an OLYMPUS BH-2 optical microscope (OLYMPUS AMERICA, Melville, N.Y.) with PANASONIC GP-KR222 digital color camera (PANASONIC USA, Seacaucus, N.J.). Surface feature heights and film thicknesses were determined by surface profilometry using a SLOAN DEKTAK³ ST (VEECO INSTRUMENTS, Histon, Cambs, United Kingdom). Atomic force microscopy (AFM) was performed using a Dimension 3100 (VEECO), and the images were processed by the manufacturer's V5.12r2 software. Area scans were recorded with unmodified silicon tips in tapping mode with a tip velocity of 2 Hz or less.

Example 1

Mask Preparation

Quartz slides were cleaned in a piranha solution (3:1 $H_2SO_4$:hydrogen peroxide 30%) for 10 min, washed with deionized water and dried with nitrogen. A 30 Å titanium layer and a 1000 Å thick gold film were deposited onto the surface of a quartz slide by evaporation using a TEMESCAL FC-1800 Electron Beam Evaporator (BOC EDWARDS, Wilmington, Mass.). The deposited metal layer was patterned into a square planar array of rectangular cavities having dimensions of 45 microns by 55 microns. This patterning was carried out by contact photolithography using SU8-5 photoresist. The patterned quartz slide was cleaned in an oxygen plasma for 15 s, the exposed gold areas were etched in a dilute (4:1) solution of TFA Gold Etch, and the exposed titanium layer etched by a 1% HF solution. The unstripped layer of the photoresist was retained as part of the final mask, providing a spacer of SU8-5 resist, with a pitch of one. The resist layer had a uniform thickness of 17 μm.

Example 2

Patterning Using Photodefined Cohesive Mechanical Failure (P-CMF)

A molded PDMS stamp was prepared as recommended by DOW CORNING in the SYLGARD 184 kit, by mixing the oligomer and initiator in a 10:1 ratio. The recommended procedure was modified by reducing the pressure (50 torr) at room temperature for several minutes with a vacuum oven to remove entrained gas bubbles. The prepolymer mixture was cast onto a master, and, after waiting 10 min for the mixture to level, the mixture was cured at 70° C. for two hours. The patterned PDMS elastomer was then extracted from the master, washed with ethanol, and dried under a stream of high purity nitrogen to provide the PDMS stamp. The final PDMS stamp had a pattern of a square array of posts, 2 μm in diameter with a center-to-center separation of 2.7 μm.

The PDMS stamp was placed into contact with the patterned side of the UVO photomask of Example 1 and irradiated through the mask for 4 minutes using a deuterium lamp. The mask was removed, and the PDMS pattern was placed into contact with a glass substrate and heated to 70° C. for 20 minutes. The PDMS stamp was then removed from the glass substrate using tweezers by peeling the stamp from a corner.

Figure 5A:
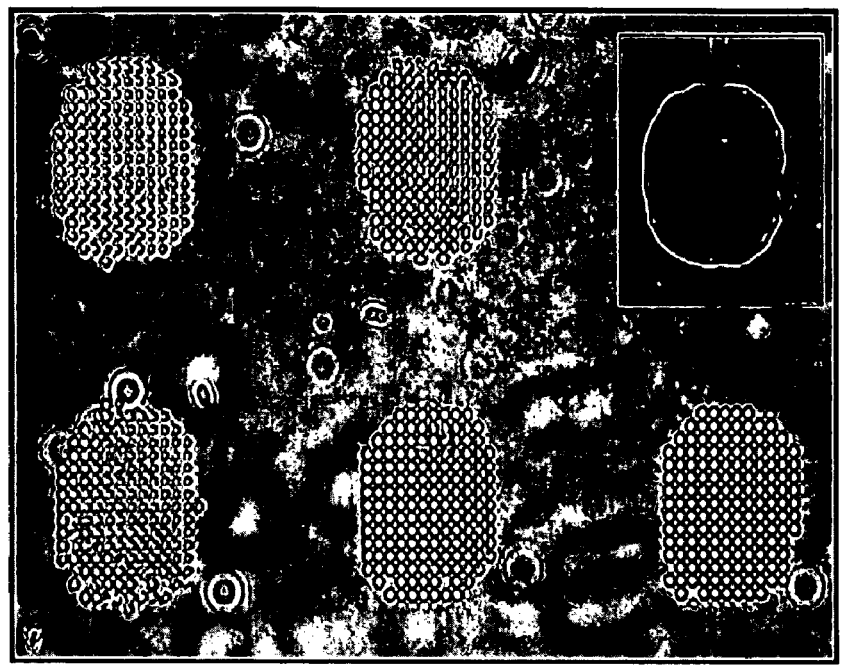
FIGS. 5A and 5B are an optical micrograph and an atomic force microscopy (AFM) line scan, respectively, of an elastomer pattern formed using P-CMF.
Figure 5B:
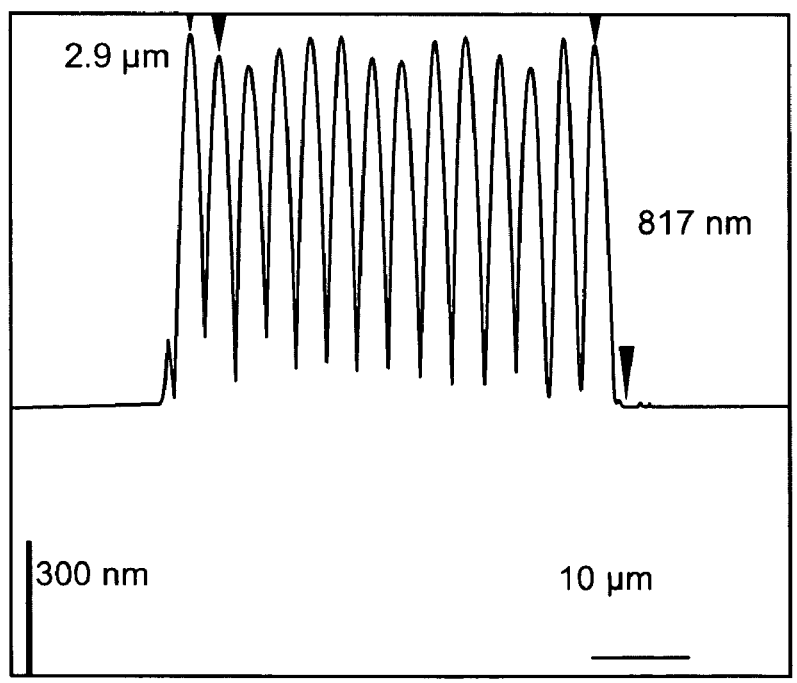

FIG. 5A is an optical micrograph of the resulting microstructure, an array of PDMS posts having the same pattern as the UV-transparent portions of the mask. The inset of FIG. 5A is an image, at the same magnification, of a UV-transparent opening in the mask. The size and spacing of the domains of the PDMS posts matched the 45×55 micron openings in the mask, with an edge resolution below the 2.0 micron pixel size of the PDMS posts. FIG. 5B is an atomic force microscopy (AFM) line scan across a domain of posts, indicating that essentially all the posts had a peak height of approximately 800 nm.

Example 3

Use of P-CMF Pattern as Resist

Figure 6A:
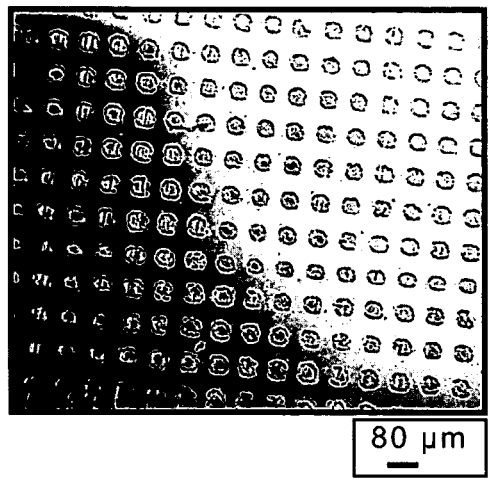
FIGS. 6A-D are optical micrographs (A & C) and an AFM line scan (B) of an elastomer pattern formed using P-CMF, and an optical micrograph (D) of a gold pattern derived from the elastomer pattern.
Figure 6B:
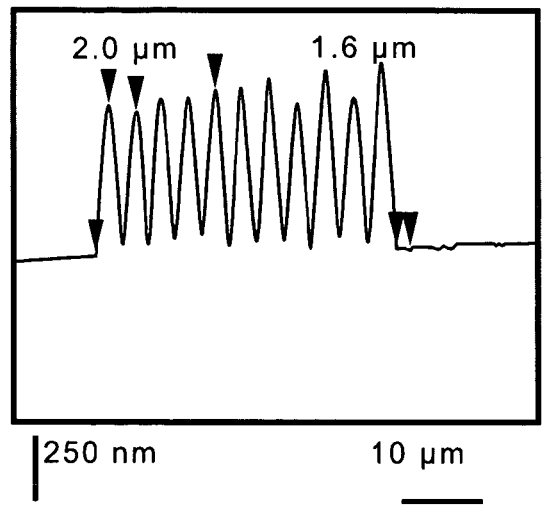
Figure 6C:
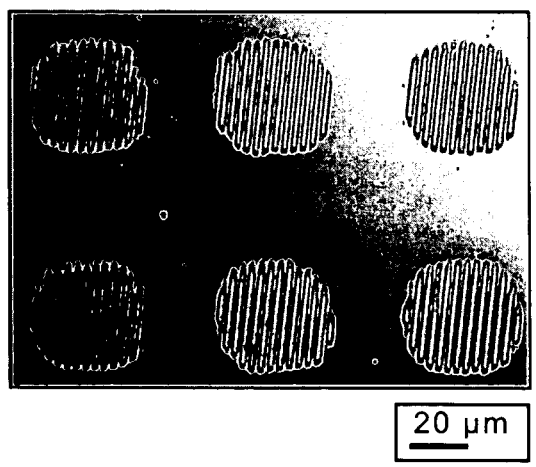
Figure 6D:
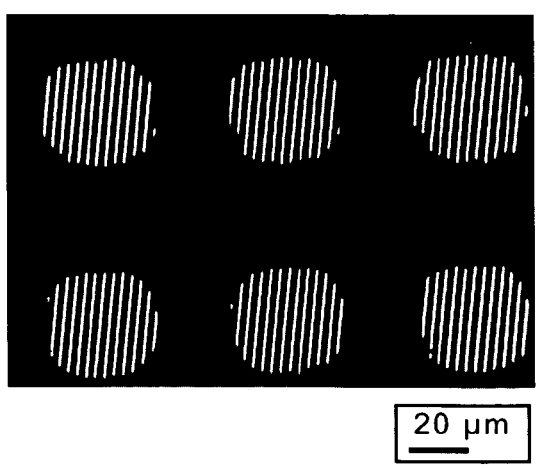

A PDMS stamp was formed as described in Example 2, except with an unbroken pattern of lines 2 μm wide and separated by 2 μm spacings. The stamp was placed into contact with the patterned side of the UVO photomask of Example 1 and irradiated through the mask for 4 minutes using a deuterium lamp. The mask was removed, and the PDMS pattern was placed into contact with a MPTMS silanized gold surface having a gold thickness of 100 nm and heated to 70° C. for 20 minutes. The PDMS stamp was then removed from the substrate using tweezers by peeling the stamp from a corner. FIGS. 6A and 6C are optical micrographs of the resulting microstructure, in which each circular domain (45×55 microns) on the gold surface contained a pattern of 2 μm wide lines of PDMS. The AFM line scan of FIG. 6B measured the height of the PDMS lines as approximately 1.6 μm.

The PDMS pattern was transferred into the gold film by wet etching the exposed gold layer and the underlying titanium layer. Stripping of the PDMS resist provided a pattern of gold lines, shown in the optical micrograph of FIG. 6D. The gold lines were 2 μm wide and were separated by a pitch of one. These lines were arranged within discrete domains, which matched the PDMS pattern of FIGS. 6A and 6C.

Example 4

Patterning Using Direct Lithography

A flat, unpatterned PDMS slab was formed by casting Sylgard 184 in a Petri dish at a thickness of 3 mm, and then curing the prepolymer for a minimum of 2 hrs at 70° C. A PDMS blank having approximate dimensions of 2 cm×3 cm was cut from this slab, washed with ethanol, and dried with nitrogen. A UVO photomask was prepared as in Example 1, except that the metal layer was patterned as 4 μm wide lines separated by 4 μm spacings. This patterning was carried out by photolithography using Shipley 1805 resist having a uniform thickness of 450 nm.

The planar PDMS blank was placed into contact with the patterned side of the UVO exposure mask and irradiated through the mask for 6 minutes using a deuterium lamp. The mask was removed, and the PDMS blank was placed into contact with a glass substrate and heated to 70° C. for 20 minutes. The PDMS was removed from the glass substrate using tweezers by pulling the blank from a corner.

Figure 7A:
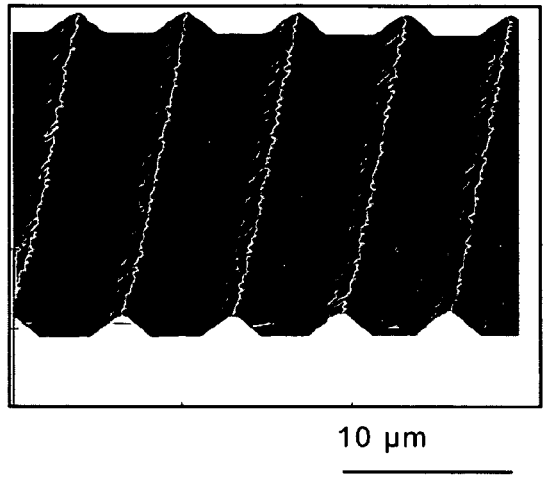
FIGS. 7A-D are an AFM image (A) and line scan (B) of an elastomer pattern formed using direct lithography, and an AFM image (C) and line scan (D) of the elastomer after the patterning process.
Figure 7B:
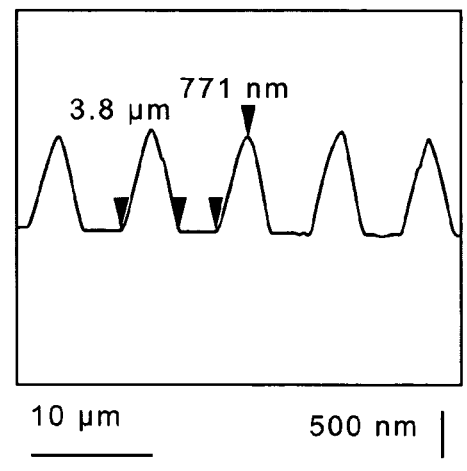
Figure 7C:
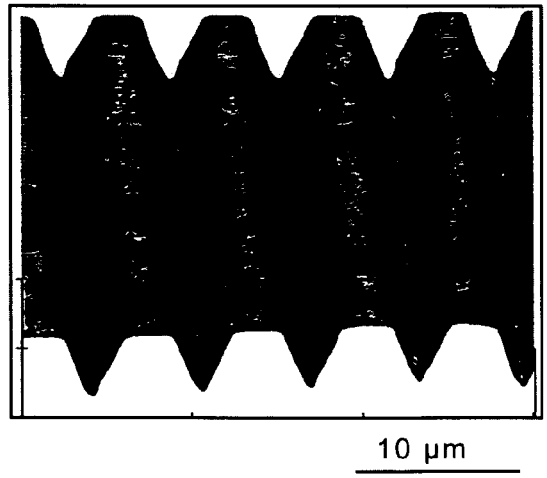
Figure 7D:
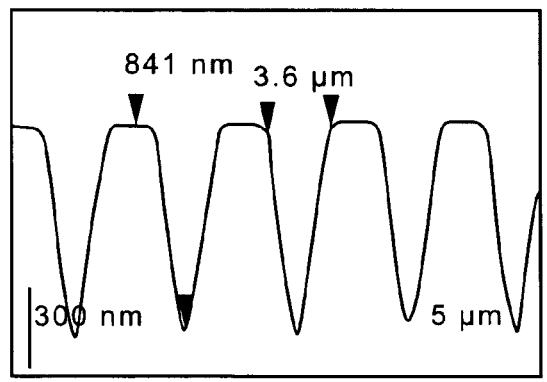

FIG. 7A is an AFM image of the resulting microstructure, with the corresponding AFM line scan in FIG. 7B. The microstructure is a pattern of tapered PDMS lines 4 μm wide, approximately 700 nm tall, with a separation of 4 μm. FIGS. 7C and 7D are the AFM image and corresponding AFM line scan of the PDMS after its removal from the glass substrate. The PDMS blank has the opposite pattern relative to the microstructure, with trenches approximately 800 μm deep and openings 4 μm wide with 4 μm spacing.

Example 5

Sub-Micron Patterning Using Direct Lithography

Figure 8A:
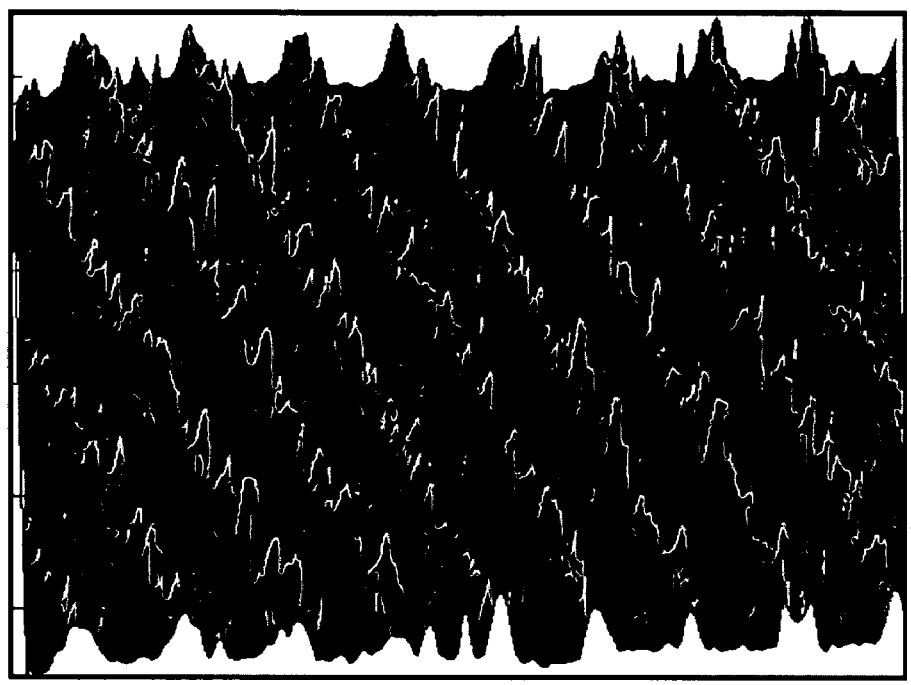
FIGS. 8A and 8B are an AFM image and line scan, respectively, of a sub-micron elastomer pattern formed using direct lithography.
Figure 8B:
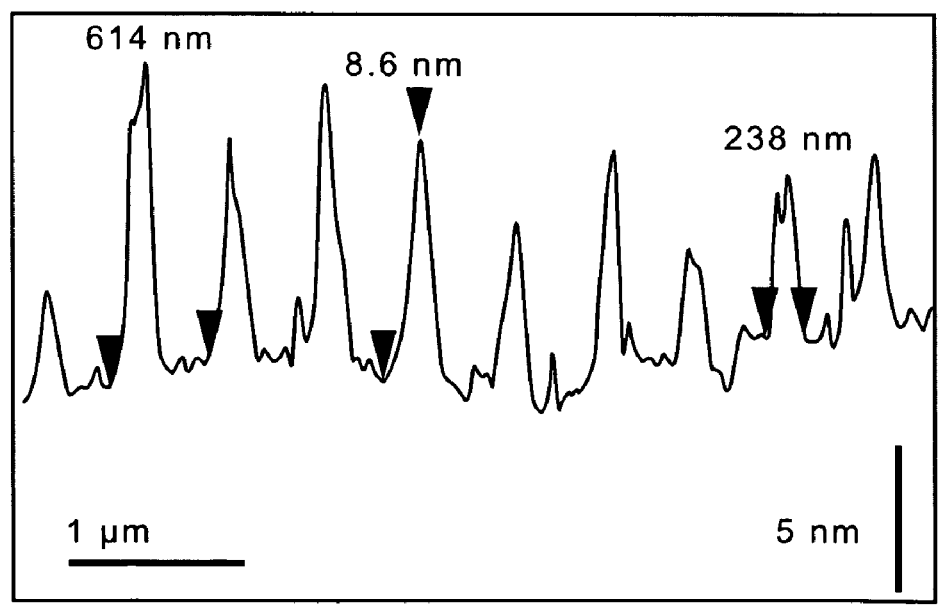

A microstructure of PDMS on a glass substrate was formed as described in Example 4, but using a different UVO photomask. The UVO photomask was prepared as in Example 4, except that the metal layer was patterned as 300 nm lines with 300 nm spacings. FIG. 8A is an AFM image of the resulting microstructure, with the corresponding AFM line scan in FIG. 8B. The microstructure is a pattern of tapered PDMS lines approximately 250 nm wide, with a separation of 350 nm and a variable height.

Example 6

Use of Direct Lithography Pattern as Resist

Figure 9A:
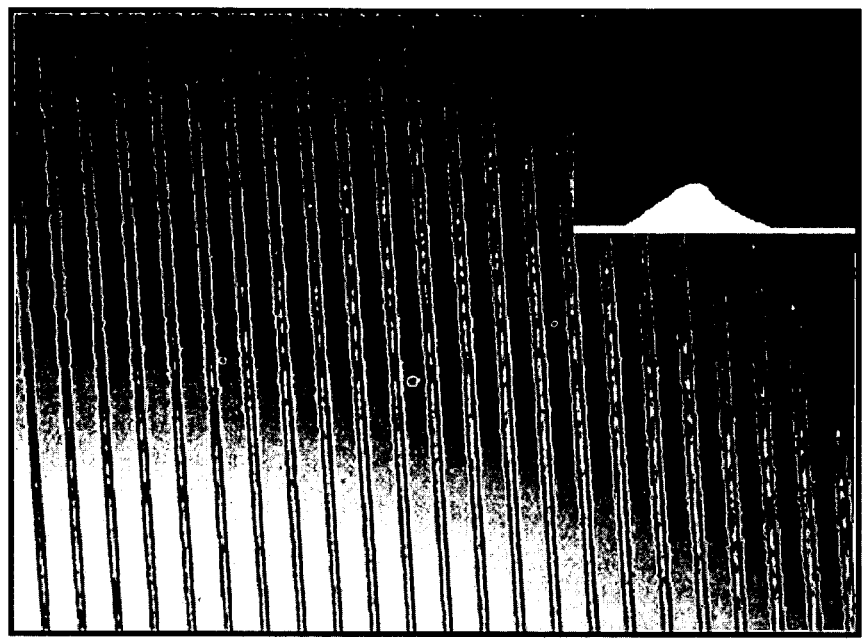
FIGS. 9A-B are an optical micrograph (A) and an AFM image (A, inset) of an elastomer pattern formed using direct lithography, and an optical micrograph (B) of a gold pattern formed from the elastomer pattern.

A UVO photomask was prepared as in Example 4, except that the metal layer was patterned as 4 μm wide lines separated by 10 μm spacings. A planar PDMS blank was placed in contact with a UVO photomask and irradiated through the mask for 6 minutes using a deuterium lamp. The blank was then placed into contact with a MPTMS silanized gold surface having a gold thickness of 100 nm and heated to 70° C. for 20 minutes. The PDMS was removed from the substrate using tweezers by peeling the blank from a corner. FIG. 9A is an optical micrograph of the resulting microstructure, having PDMS lines 4.1 μm wide with a peak height of 698 nm. The inset of FIG. 9A is an AFM image of a single PDMS line within this microstructure.

Figure 9B:
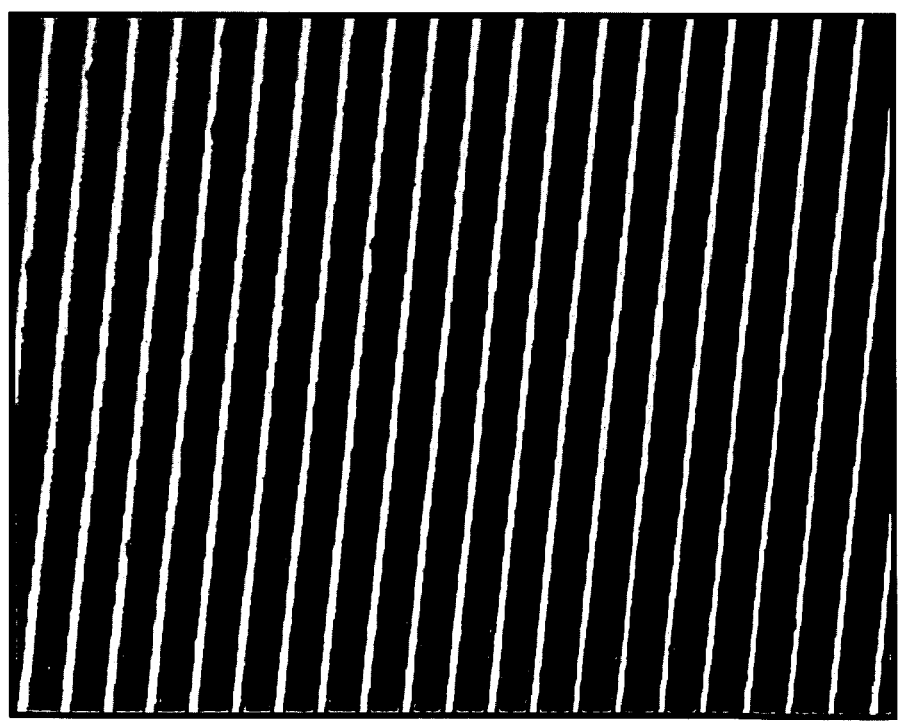

The PDMS pattern was transferred into the gold film by wet etching the exposed gold layer and the underlying titanium layer. Stripping of the PDMS resist provided a pattern of gold lines, shown by the optical micrograph of FIG. 9B.

Example 7

Use of Direct Lithography for 3-Dimensional Patterning

A UVO photomask was prepared as in Example 4, except that the metal layer was patterned as 3 μm wide lines separated by 3 μm spacings. A planar PDMS blank was placed in contact with a UVO photomask and irradiated through the mask for 30 minutes using a deuterium lamp. The blank was then placed into contact with a glass substrate and heated to 70° C. for 20 minutes. The PDMS was removed from the substrate using tweezers by peeling the blank from a corner.

Figure 10A:
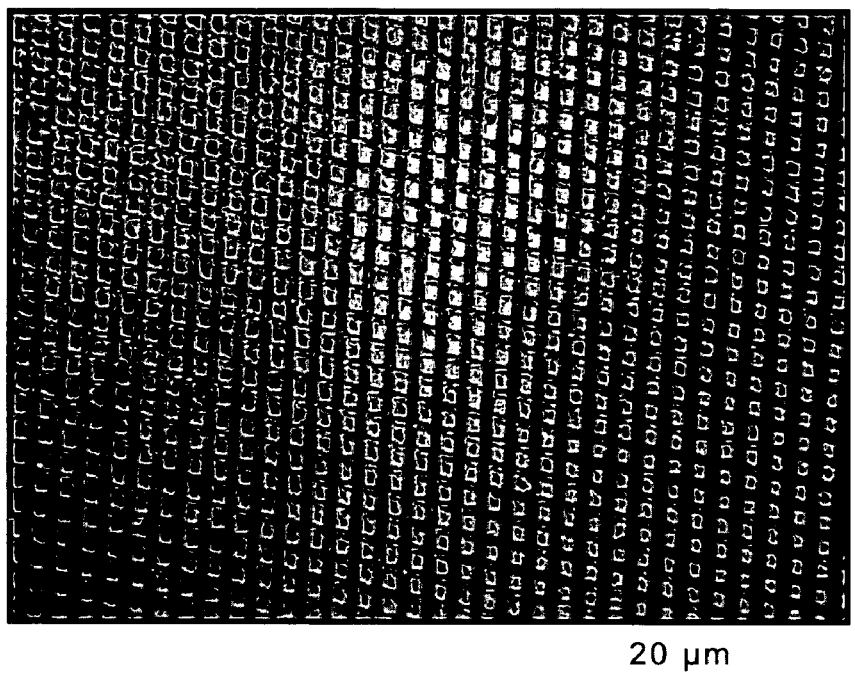
FIGS. 10A-B are an optical micrograph (A) and an AFM image (B) of an elastomer pattern formed using direct lithography.
Figure 10B:
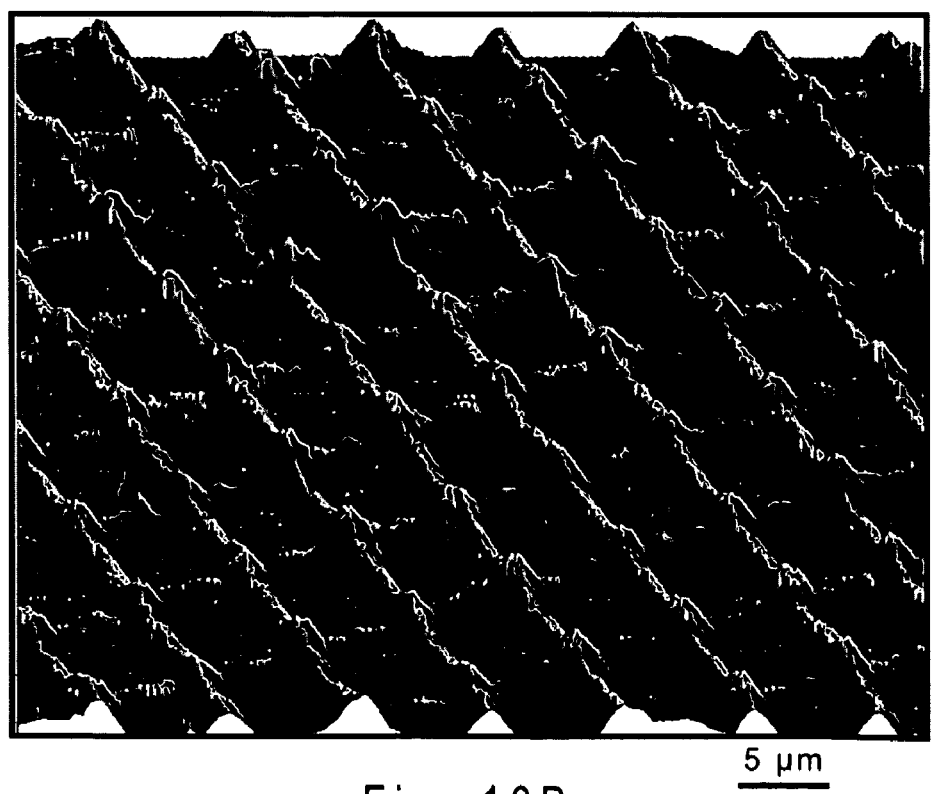

A second planar PDMS blank was placed in contact with the same UVO photomask and irradiated through the mask for 15 minutes using a deuterium lamp. The PDMS pattern on the glass substrate was also exposed to UVO for 15 minutes, but without an intervening mask. The second treated blank was placed into contact with the glass substrate having the PDMS pattern; however, the second blank was oriented so that the activated lines on the surface of the second blank were perpendicular to the PDMS lines already on the glass surface. The entire assembly was heated to 140° C. for 40 minutes, and the second PDMS blank was removed using tweezers by peeling the blank from a corner. FIG. 10A is an optical micrograph of the resulting microstructure, having perpendicular sets of PDMS lines approximately 3 μm wide. FIG. 10B is an AFM image of this microstructure, showing the doubled height of the microstructure at the intersections of the lines.

Example 8

Use of Direct Lithography for Patterning of Discrete Material

A UVO photomask was prepared as in Example 4, except that the metal layer was patterned as 100 μm×100 μm squares separated by 100 μm spacings. A silicon on insulator wafer (SOI, Janus) was patterned to form a rectangular array of silicon structures approximately 10 μm×3 μm on a silicon dioxide layer.

A planar PDMS blank was placed in contact with a UVO photomask and irradiated through the mask for 6 minutes using a mercury lamp positioned approximately 3 centimeters from the blank. During this irradiation time, the patterned SOI wafer etched in a stirred 49% HF solution for 1 minute 35 seconds to undercut the silicon structures and form single crystal silicon wires having dimensions of approximately 10 μm×3 μm. After removal from the HF solution, the SOI wafer was rinsed with water and gently blown dry with nitrogen. The etching step was timed to conclude 45 seconds prior to the end of the 6 minute UVO exposure. This amount of time was sufficient to rinse, dry, and move the sample into position for the contact step.

The blank was then placed into contact with the patterned face of the SOI wafer and heated in an oven to 70° C. for 30 minutes. The assembly was removed from the oven and placed, with the SOI side down, on a hotplate set at 300° C. for 20 seconds. The assembly was then submerged in liquid nitrogen for 10 seconds. After allowing the assembly to warm to room temperature for several seconds, the PDMS was sufficiently flexible and was removed from the substrate using tweezers by peeling the blank from a corner.

Figure 11A:
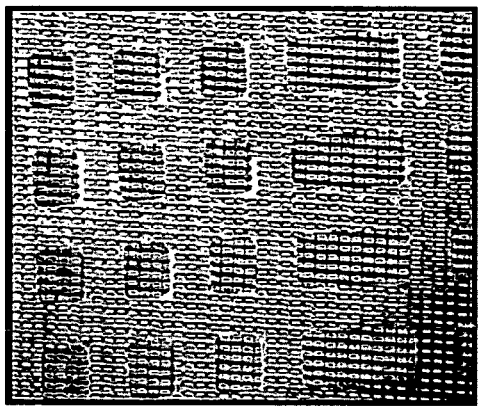
FIGS. 11A-D are optical micrographs of a SOI wafer (A-B) and of the corresponding silicon-containing elastomer (C-D), each of which have a pattern of silicon wires.
Figure 11B:
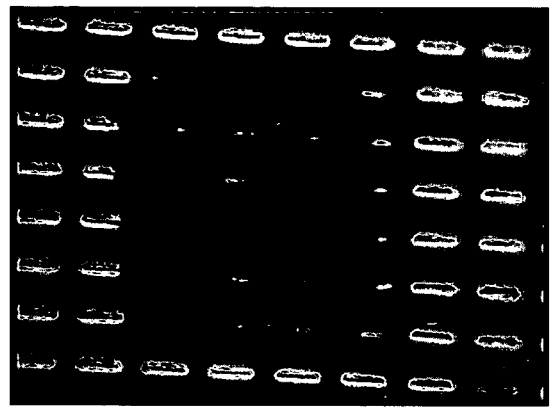
Figure 11C:
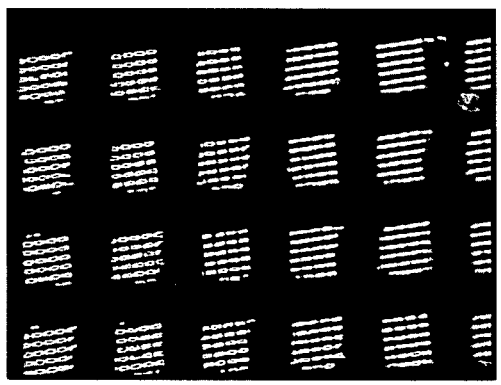
Figure 11D:
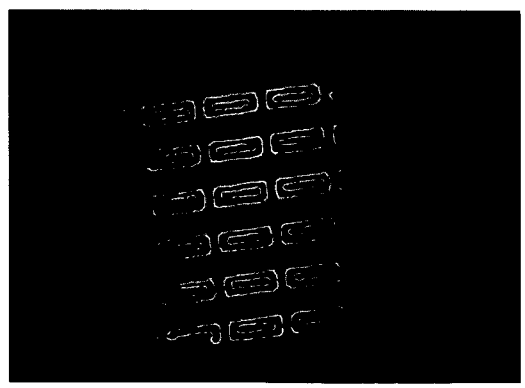

FIGS. 11A and 11B are optical micrographs of the SOI wafer after patterning by direct lithography. The 100 μm×100 μm squares correspond to regions without any silicon wires. FIGS. 11C and 11D are optical micrographs of the PDMS blank, having a pattern of 100 μm×100 μm squares containing arrays of single crystal silicon wires.

It is therefore intended that the foregoing detailed description be regarded as illustrative rather than limiting, and that it be understood that it is the following claims, including all equivalents, that are intended to define the spirit and scope of this invention.

The invention claimed is:

1. A method of making a microstructure, comprising:
    selectively activating an exposed portion of a surface of a silicon-containing elastomer by irradiating the exposed portion with UV radiation through a mask, while covering a protected portion of the surface with the mask,
        where during the irradiating the exposed portion is in contact with an atmosphere containing oxygen, and the mask is in contact with the protected portion;
    removing the mask from the surface of the silicon-containing elastomer;
    contacting the surface of the silicon-containing elastomer with a substrate; and
    bonding the activated portion and the substrate, such that the activated portion and a portion of the substrate in contact with the activated portion are irreversibly attached.

2. The method of claim 1, wherein the mask comprises a hard mask on the protected portion of the surface.

3. The method of claim 1, wherein the mask comprises a free-standing mask comprising a pattern of UV-opaque portions and UV-transparent portions, and comprising a spacer material under the UV-opaque portions; and
    exposed portion of the surface is below and spaced apart from the UV-transparent portions.

4. The method of claim 1, wherein at least the exposed portion is in contact with an atmosphere enriched in molecular oxygen during the irradiation.

5. The method of claim 1, wherein at least the exposed portion is in contact with an atmosphere enriched in ozone during the irradiation.

6. The method of claim 1, wherein the bonding comprises heating the silicon-containing elastomer and the substrate.

7. The method of claim 1, wherein the surface of the silicon-containing elastomer is planar.

8. The method of claim 1, wherein the surface of the silicon containing elastomer comprises a pattern of raised areas and lowered areas.

9. The method of claim 1, further comprising separating the silicon-containing elastomer and the substrate.

10. The method of claim 9, wherein the substrate and the activated portion of the surface remain in contact.

11. The method of claim 9, wherein the silicon-containing elastomer and the portion of the substrate in contact with the activated portion of the surface remain in contact.

12. A method of selectively activating a surface, comprising:
    positioning a mask on a surface of a silicon-containing elastomer;
        the mask comprising a pattern of UV-opaque portions and UV-transparent portions, and comprising a spacer material under the UV-opaque portions;
    the surface comprising an exposed portion below and spaced apart from the UV-transparent portions, and a protected portion covered with the mask;
    irradiating the exposed portion of the surface with UV radiation; and
    contacting the exposed portion with an atmosphere enriched in molecular oxygen or ozone during the irradiation;

where the mask is in contact with the protected portion during the irradiating.

13. The method of claim 10, wherein the separating comprises inducing cohesive failure within the silicon-containing elastomer.

14. The method of claim 10, wherein a layer of silicon-containing elastomer remains connected to the activated portion of the surface after the separating.

15. The method of claim 14, further comprising controlling the thickness of the layer by adjusting the duration of the irradiating.

16. The method of claim 10, wherein a minimum feature size of the activated portion of the surface on the substrate after the separating is less than 1 micrometer.

17. The method of claim 10, further comprising, after the separating,
    applying an etching agent to the substrate to remove a portion of the substrate which is not in contact with the activated portion of the surface; and
    removing the silicon-containing elastomer from the substrate.

18. The method of claim 10, further comprising, after the separating,
    depositing a material on the substrate; and
    removing the silicon-containing elastomer from the substrate to provide a pattern of the deposited material.

19. The method of claim 1, wherein the substrate is non-planar.

20. The method of claim 8, wherein the pattern of raised and lowered areas is configured as an array.

21. The method of claim 1, wherein the silicon-containing elastomer comprises a member selected from the group consisting of polysiloxanes; block copolymers comprising segments of a polysiloxane; and silicon-modified elastomers.

22. The method of claim 1, wherein the substrate comprises a member selected from the group consisting of silicon, silicon oxide, quartz, glass, a polymer, and a metal.

23. The method of claim 12, wherein the spacer material has a thickness of at least 100 nanometers.

24. The method of claim 12, wherein the spacer material has a thickness of at least 0.5 micrometers.

25. The method of claim 12, wherein the spacer material has a thickness of at least 3 micrometers.

26. The method of claim 12, wherein the spacer material comprises a photoresist.

27. The method of claim 12, wherein the silicon-containing elastomer comprises a member selected from the group consisting of polysiloxanes; block copolymers comprising segments of a polysiloxane; and silicon-modified elastomers.

28. The method of claim 12, wherein the silicon-containing elastomer comprises a polysiloxane.

29. The method of claim 12, wherein the silicon-containing elastomer comprises poly(dimethyl siloxane).

30. The method of claim 3, wherein the spacer material has a thickness of at least 100 nanometers.

31. The method of claim 3, wherein the spacer material has a thickness of at least 0.5 micrometers.

32. The method of claim 3, wherein the spacer material has a thickness of at least 3 micrometers.

33. The method of claim 3, wherein the spacer material comprises a photoresist.

* * * * *